United States Patent
Xu

(10) Patent No.: US 10,367,159 B2
(45) Date of Patent: Jul. 30, 2019

(54) ORGANIC LIGHT-EMITTING DEVICE AND ORGANIC LIGHT-EMITTING DISPLAY APPARATUS

(71) Applicant: WUHAN CHINA STAR OPTOELECTRONICS SEMICONDUCTOR DISPLAY TECHNOLOGY CO., LTD., Wuhan, Hubei (CN)

(72) Inventor: Chao Xu, Hubei (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 15/735,199

(22) PCT Filed: Nov. 16, 2017

(86) PCT No.: PCT/CN2017/111265
§ 371 (c)(1),
(2) Date: Dec. 11, 2017

(87) PCT Pub. No.: WO2019/061733
PCT Pub. Date: Apr. 4, 2019

(65) Prior Publication Data
US 2019/0097154 A1    Mar. 28, 2019

(30) Foreign Application Priority Data

Sep. 27, 2017 (CN) .......................... 2017 1 0888541

(51) Int. Cl.
*H01L 51/50* (2006.01)
*H01L 51/52* (2006.01)
*H01L 51/00* (2006.01)

(52) U.S. Cl.
CPC ...... *H01L 51/5012* (2013.01); *H01L 51/0097* (2013.01); *H01L 51/5056* (2013.01);
(Continued)

(58) Field of Classification Search
CPC ............ H01L 51/5012; H01L 51/0097; H01L 51/5056; H01L 51/5072; H01L 51/5206; H01L 51/5221; H01L 51/5237
(Continued)

(56) References Cited

U.S. PATENT DOCUMENTS

2015/0364523 A1* 12/2015 Sato ...................... H01L 51/502
257/13
2016/0049612 A1* 2/2016 Kim ..................... H01L 51/5268
257/88

(Continued)

*Primary Examiner* — Long K Tran
(74) *Attorney, Agent, or Firm* — Soroker Agmon Nordman

(57) ABSTRACT

The present disclosure provides an organic light-emitting device and an organic light-emitting display apparatus. The organic light-emitting device includes a first electrode layer; an organic light-emitting layer disposed on a surface of the first electrode layer, wherein the organic light-emitting layer includes a light-emitting area and a non-light-emitting area; and a second electrode layer disposed on a surface of the organic light-emitting layer away from the first electrode layer, wherein the second electrode layer is correspondingly disposed on a surface of the non-light-emitting area such that light emitted from the light-emitting area passes through the second electrode layer.

14 Claims, 2 Drawing Sheets

(52) U.S. Cl.
CPC ...... *H01L 51/5072* (2013.01); *H01L 51/5206* (2013.01); *H01L 51/5221* (2013.01); *H01L 51/5237* (2013.01); *H01L 2251/5315* (2013.01)

(58) Field of Classification Search
USPC .......................................................... 257/40
See application file for complete search history.

(56) References Cited

U.S. PATENT DOCUMENTS

2017/0220181 A1* 8/2017 Li ........................ H01L 51/5064
2017/0315651 A1* 11/2017 Han ...................... G06F 3/0488

* cited by examiner

ORGANIC LIGHT-EMITTING DEVICE AND ORGANIC LIGHT-EMITTING DISPLAY APPARATUS

FIELD OF DISCLOSURE

The present disclosure relates to the field of display techniques, and more particularly to an organic light-emitting device and an organic light-emitting display apparatus.

BACKGROUND

Because of its many outstanding properties, including high brightness, short response time, low power consumption, and flexibility, organic light-emitting diode (OLED) displays are considered as a mainstream, next generation display technique.

Currently, in order to manufacture transparent active matrix organic light-emitting diode (AMOLED) displays, transparent electrodes are used as anodes, cathodes are made of semi-transparent magnesium-silver alloy, which is formed by blanket vapor deposition. However, if cathodes are too thin in thickness, conductivity of cathodes would be too low, and magnesium tends to be oxidized. On the other hand, if cathodes are too thick in thickness, light transmission of cathodes would be too low, and thus light-emitting efficiency of organic light-emitting device could be too low.

SUMMARY OF DISCLOSURE

The present disclosure provides an organic light-emitting device and an organic light-emitting display apparatus including the organic light-emitting device. The present disclosure solves the problems existing in conventional organic light-emitting device where both light transmission of cathodes and conductivity of cathodes cannot simultaneously satisfy required conditions, therefore the present disclosure increases light extraction efficiency of the organic light-emitting device.

In a first aspect, the present disclosure provides an organic light-emitting device, including:
a first electrode layer;
an organic light-emitting layer disposed on a surface of the first electrode layer, wherein the organic light-emitting layer includes a light-emitting area and a non-light-emitting area, the light-emitting area corresponds to a region where a plurality of pixel units are disposed, and the on-light-emitting area corresponds to a pixel defining region among the pixel units; and
a second electrode layer disposed on a surface of the organic light-emitting layer away from the first electrode layer, wherein the second electrode layer is correspondingly disposed on a surface of the non-light-emitting area such that a light emitted from the light-emitting area passes through the second electrode layer.

According to one preferred embodiment of the present disclosure, the organic light-emitting device is a top-emitting organic light-emitting device.

According to one preferred embodiment of the present disclosure, the first electrode layer is an anode electrode layer, and the second electrode layer is a cathode electrode layer.

According to one preferred embodiment of the present disclosure, the second electrode layer includes a plurality of grid-shaped electrodes or a plurality of strip-shaped electrodes.

According to one preferred embodiment of the present disclosure, the second electrode layer includes the grid-shaped electrodes, the grid-shaped electrodes have high conductivity, and the grid-shaped electrodes are made of silver, copper, carbon nanotube, graphene, or any combination thereof.

According to one preferred embodiment of the present disclosure, the cathode electrode layer includes the grid-shaped electrodes, and the anode electrode layer is composed of at least two anode electrode regions;
the anode electrode regions are defined by the grid-shaped electrodes, the anode electrode regions have a convex structure, and a raised portion of the anode electrode regions approaches the cathode electrode layer.

In a second aspect, the present disclosure provides an organic light-emitting display apparatus, including any one of the above described organic light-emitting devices.

According to one preferred embodiment of the present disclosure, the organic light-emitting display apparatus has an active matrix top-emitting structure.

According to one preferred embodiment of the present disclosure, the organic light-emitting display apparatus further comprises a flexible substrate, an array of thin film transistors, the organic light-emitting device, and a film encapsulation layer.

In a third aspect, the present disclosure provides an organic light-emitting device, including:
a first electrode layer;
an organic light-emitting layer disposed on a surface of the first electrode layer, wherein the organic light-emitting layer includes a light-emitting area and a non-light-emitting area; and
a second electrode layer disposed on a surface of the organic light-emitting layer away from the first electrode layer, wherein the second electrode layer is correspondingly disposed on a surface of the non-light-emitting area such that a light emitted from the light-emitting area passes through the second electrode layer.

According to one preferred embodiment of the present disclosure, the organic light-emitting device is a top-emitting organic light-emitting device.

According to one preferred embodiment of the present disclosure, the first electrode layer is an anode electrode layer, and the second electrode layer is a cathode electrode layer.

According to one preferred embodiment of the present disclosure, the second electrode layer includes a plurality of grid-shaped electrode or a plurality of strip-shaped electrodes.

According to one preferred embodiment of the present disclosure, the electrode layer includes the grid-shaped electrodes, the grid-shaped electrodes have high conductivity, and the grid-shaped electrodes are made of silver, copper, carbon nanotube, graphene, or any combination thereof.

According to one preferred embodiment of the present disclosure, the cathode electrode layer includes the grid-shaped electrodes, and the anode electrode layer is composed of at least two anode electrode regions;
the anode electrode regions are defined by the grid-shaped electrodes, the anode electrode regions have a convex structure, and a raised portion of the anode electrode regions approaches the cathode electrode layer.

The present disclosure provides an organic light-emitting device and an organic light-emitting display apparatus including the organic light-emitting device. By disposing the cathode electrodes on a surface of the non-light-emitting area and properly controlling width and density of the cathode electrodes, both light transmission of cathodes and conductivity of cathodes can simultaneously satisfy required conditions, increasing light extract on efficiency of the organic light-emitting device.

BRIEF DESCRIPTION OF DRAWINGS

To explain in detail the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
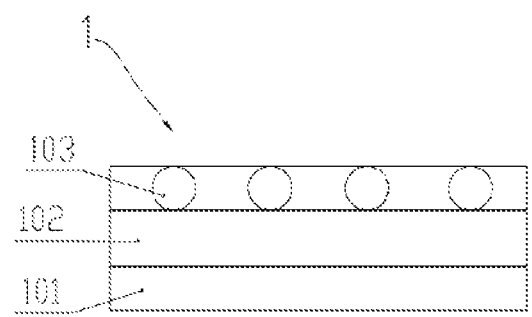
FIG. 1 is a schematic diagram showing a cross-sectional structure of an organic light-emitting device according to one embodiment of the present disclosure.

The following embodiments refer to the accompanying drawings for exemplifying specific implementable embodiments of the present disclosure. Moreover, directional terms described by the present disclosure, such as upper, lower, front, back, left right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

To solve the problems existing in conventional organic light-emitting device where cathodes are made of alloy in whole surface, leading to low light-emitting efficiency of light-emitting device, the present disclosure provides an organic light-emitting device and an organic light-emitting display apparatus.

Detailed explanation will be provided for preferred embodiments of the present disclosure in the following description with reference to the accompanying drawings.

As can be seen in FIG. 1, the present disclosure provides an organic light-emitting device 1, characterized in that the organic light-emitting device 1 includes a first electrode layer 101, an organic light-emitting layer 102, and a second electrode layer 103.

The first electrode layer 101 is configured as an anode electrode of the organic light-emitting device 1. Generally, a transparent indium-tin-oxide (ITO) conductive glass with a high work function is used to constitute the first electrode layer 101, and such anode electrode is flexible.

The organic light-emitting layer 102 is disposed on a surface of the first electrode layer. The organic light-emitting layer 102 includes a light-emitting area 1021 and a non-light-emitting area 1022.

The light-emitting area 1021 corresponds to a region where a plurality of pixel units are disposed. Disposed between adjacent pixel units is a pixel defining body. All the pixel defining bodies collectively constitute a pixel defining region. In other words, the pixel defining region is the non-light-emitting area 1022 of the organic light-emitting layer 102.

Structurally, the organic light-emitting layer 102 includes a hole transport layer, a luminescent layer, and an electron transport layer sequentially disposed from bottom to top. The hole transport layer attaches to the first electrode layer 101.

The second electrode layer 103 is configured as an cathode electrode of the organic light-emitting device 1, and is disposed on a surface of the organic light-emitting layer 102 away from the first electrode layer 101. The second electrode layer 103 is correspondingly disposed on a surface of the non-light-emitting area 1022 such that a light emitted from the light-emitting area 1021 passes through the second electrode layer 103.

According to the present disclosure, the organic light-emitting device 1 is a top-emitting organic light-emitting device.

The second electrode layer 103 includes a plurality of electrodes selected from one of a grid-shaped electrode and a strip-shaped electrode.

The grid-shaped electrodes of the second electrode layer 103 are generally made of a material having high conductivity, including silver, copper, carbon nanotube, graphene, or any combination thereof.

The second electrode layer 103 is typically formed using vapor deposition technique, inkjet printing technique, or screen printing technique.

Figure 2:
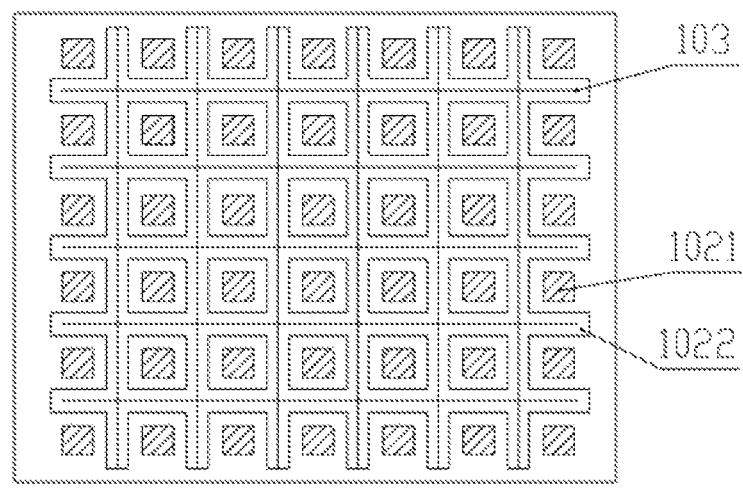
FIG. 2 shows a top view of an organic light-emitting device according to one embodiment of the present disclosure.

As shown in FIG. 2, to make the second electrode layer 103 have excellent conductivity without causing transmission of light through the second electrode layer 103 too low, the second electrode layer 103 has a grid-shaped structure. The grid-shaped electrodes are designed based on size of the pixel units, in order to have a size without blocking light emitted from the light-emitting area 1021. That is, the grid-shaped electrodes are disposed on a surface of the pixel defining region.

The grid-shaped electrodes include at least three horizontal electrodes that are parallel to each other and at least three vertical electrodes that are parallel. The horizontal electrodes are perpendicular the vertical electrodes. An interval between the horizontal electrodes and an interval between the vertical electrodes are defined by length and width of each of pixel in the organic light-emitting device 1. Such design can effectively solve the problem that transmission of light through cathodes would be too low due to whole-surface cathode electrode structure.

Regarding structure of the organic light-emitting device, the organic light-emitting layer 102 is disposed between the anode electrodes and the cathode electrodes. With an electric field externally applied, electrons in the cathode electrodes and holes in the anode electrodes are injected into the organic light-emitting layer 102 sandwiched between the anode electrodes and the cathode electrodes. The injected electrons and holes are moved from the electron transport layer and the hole t sport layer toward the luminescent layer such that electrons and holes combine in the light-emitting layer to generate excitons. Excitons migrate in the electric filed, transfer energy to the luminescent materials, and excite electrons from the ground state to the excited state. Decay of this excited state results in relaxation of energy levels of electrons accompanied by emission of radiation, generation of photons, and release of energy.

The cathode electrode layer includes, the grid-shaped electrodes, and the anode electrode layer is composed of at least two anode electrode regions.

The anode electrode regions are defined by the grid-shaped electrodes. Each of the anode electrode regions have a convex structure. And, a raised portion of each of the anode electrode regions approaches the cathode electrode layer.

The raised portion of each of the anode electrode regions is configured to correspond to a middle point of two adjacent grid-shaped electrodes. With such configuration, the distance between the raised portions of the anode electrode regions and the grid-shaped electrodes is shortest, therefore the light-emitting area of the organic light-emitting layer 102 is close to the grid-shaped electrodes, preventing the grid-shaped electrodes from blocking light and thus increasing light-emitting efficiency of organic light-emitting device 1.

The electron transport layer directly contacts the second electrode layer 103. To increase electron transport ability of the electron transport layer, the electron transport layer is generally made of a material having high conductivity, such as lithium fluoride, cesium carbide, boron fluoronitride, or any combination thereof.

The electron transport layer is generally formed by vapor deposition, spray coating or spin coating.

In one embodiment of the present disclosure, the organic light-emitting device 1 further includes an array of thin film transistors. The thin film transistors are covered entirely by the first electrode layer 101 and constitute an array. The thin film transistors function as a circuit and determine which one of pixels in the organic light-emitting device 1 would emit light, which generate images.

Figure 3:
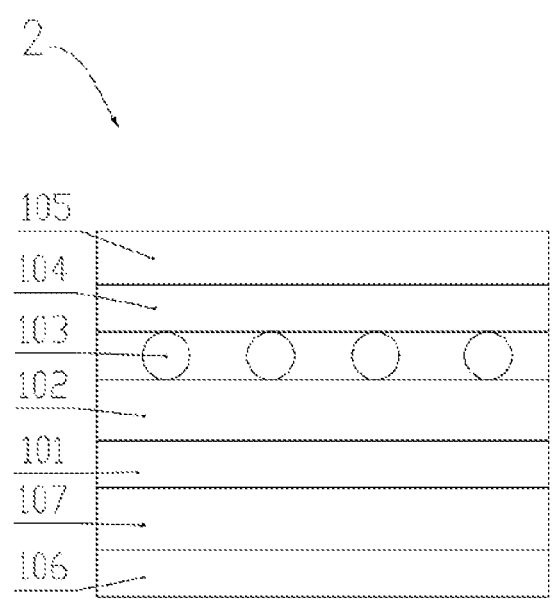
FIG. 3 is a schematic diagram showing a cross-sectional structure of an organic emitting display apparatus according to one embodiment of the present disclosure.

Additionally, the present disclosure provides an organic light-emitting display apparatus 2, as shown in FIG. 3. The organic light-emitting display apparatus 2 includes an organic light-emitting device 1. The organic light-emitting device 1 is any one of the organic light-emitting devices 1 described above.

The organic light-emitting display apparatus 2 includes a flexible substrate 106, a array of thin film transistors 107, the organic light-emitting device 1, and a film encapsulation layer 105.

The flexible substrate 106 is made of a flexible material, generally made of a pliable metal foil or a plastic material. The array of thin film transistors 107 is used to control open/close of pixels in the organic light-emitting device 1, and further control images presented by the organic light-emitting display apparatus 2.

In one embodiment of the present disclosure, the organic light-emitting display apparatus 2 is an active matrix top-emitting organic light-emitting display apparatus. Because the array of thin film transistors 107 in the active matrix organic light-emitting display apparatus requires fewer electricity than external circuits, the active matrix organic light-emitting display apparatus has lower power consumption than passive matrix organic light-emitting display apparatus. Thus, the active matrix organic light-emitting display apparatus is applied in large-sized display screens.

The present disclosure provides an organic light-emitting device and an organic light-emitting display apparatus including the organic light-emitting device. By disposing the cathode electrodes on a surface of the non-light-emitting area and properly controlling width and density of the cathode electrodes, both light transmission of cathodes and conductivity of cathodes can simultaneously satisfy required conditions, increasing light extraction efficiency of the organic light-emitting device.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An organic light-emitting device, comprising:
    a first electrode layer;
    an organic light-emitting layer disposed on a surface of the first electrode layer, wherein the organic light-emitting layer includes a light-emitting area and a non-light-emitting area, the light-emitting area corresponding to a region where a plurality of pixel units are disposed, and the non-light-emitting area corresponding to a pixel defining region among the pixel units; and
    a second electrode layer disposed on a surface of the organic light-emitting layer away from the first electrode layer, wherein the second electrode layer includes a plurality of grid-shaped electrodes or a plurality of strip-shaped electrodes, and the grid-shaped electrodes or the strip-shaped electrodes are correspondingly disposed on a surface of the non-light-emitting area, and do not have any portion disposed on a surface of the light-emitting area, such that light emitted from the light-emitting area passes through the second electrode layer.

2. The organic light-emitting device according to claim 1, wherein the organic light-emitting device is a top-emitting organic light-emitting device.

3. An organic light-emitting display apparatus, comprising the organic light-emitting device according to claim 2.

4. The organic light-emitting device according to claim 2, wherein the first electrode layer is an anode electrode layer, and the second electrode layer is a cathode electrode layer.

5. An organic light-emitting display apparatus, comprising the organic light-emitting device according to claim 4.

6. The organic light-emitting device according to claim 1, wherein the second electrode layer includes the grid-shaped electrodes, the grid-shaped electrodes have high conductivity, and the grid-shaped electrodes are made of silver, copper, carbon nanotube, graphene, or any combination thereof.

7. An organic light-emitting display apparatus, comprising the organic light-emitting device according to claim 6.

8. An organic light-emitting display apparatus, comprising the organic light-emitting device according to claim 1.

9. The organic light-emitting display apparatus according to claim 8, wherein the organic light-emitting display apparatus has an active matrix top-emitting structure.

10. The organic light-emitting display apparatus according to claim 8, wherein the organic light-emitting display apparatus further comprises a flexible substrate, an array of thin film transistors, the organic light-emitting device, and a film encapsulation layer.

11. An organic light-emitting device, comprising:
    a first electrode layer;
    an organic light-emitting layer disposed on a surface of the first electrode layer, wherein the organic light-emitting layer includes a light-emitting area and a non-light-emitting area; and
    a second electrode layer disposed on a surface of the organic light-emitting layer away from the first electrode layer, wherein the second electrode layer includes a plurality of grid-shaped electrodes or a plurality of strip-shaped electrodes, and the grid-shaped electrodes or the strip-shaped electrodes are correspondingly disposed on a surface of the non-light-emitting area, and do not have any portion disposed on a surface of the light-emitting area, such that a light emitted from the light-emitting area passes through the second electrode layer.

12. The organic light-emitting device according to claim 11, wherein the organic light-emitting device is a top-emitting organic light-emitting device.

13. The organic light-emitting device according to claim 12, wherein the first electrode layer is an anode electrode layer, and the second electrode layer is a cathode electrode layer.

14. The organic light-emitting device according to claim 11, wherein the electrode layer includes the grid-shaped electrodes, the grid-shaped electrodes have high conductivity, and the grid-shaped electrodes are made of silver, copper, carbon nanotube, graphene, or any combination thereof.

* * * * *